United States Patent [19]
Smith et al.

[11] Patent Number: 5,560,543
[45] Date of Patent: Oct. 1, 1996

[54] HEAT-RESISTANT BROAD-BANDWIDTH LIQUID DROPLET GENERATORS

[75] Inventors: Charles V. Smith, Pantego; John W. Priest, Dallas; Patrick N. DuBois, Argyle, all of Tex.

[73] Assignee: Board of Regents, The University of Texas System, Austin, Tex.

[21] Appl. No.: 308,811

[22] Filed: Sep. 19, 1994

[51] Int. Cl.⁶ .................................................. B05B 1/08
[52] U.S. Cl. ..................... 239/102.2; 239/135; 310/331
[58] Field of Search ................................. 239/102.2, 135, 239/4; 310/328, 358, 330, 331, 345

[56] References Cited

U.S. PATENT DOCUMENTS

| | | | |
|---|---|---|---|
| 2,779,623 | 1/1957 | Eisenkraft | 239/102.2 |
| 2,789,008 | 4/1957 | Cronin | 239/102.2 |
| 3,281,860 | 10/1966 | Adams et al. | 239/102.2 |
| 3,298,030 | 1/1967 | Lewis et al. | 346/75 |
| 3,683,212 | 8/1972 | Zoltan | 310/8.3 |
| 3,700,169 | 10/1972 | Naydan et al. | 239/102.2 |
| 3,739,393 | 6/1973 | Lyon et al. | 239/102.2 |

(List continued on next page.)

FOREIGN PATENT DOCUMENTS

| 91204 | 4/1994 | Japan | 239/102.2 |
|---|---|---|---|

OTHER PUBLICATIONS

Hayes, et al., "Picoliter Solder Droplet Dispensing," *MicroFab Technologies, Inc., ISHM '92*, pp. 1–6 (Oct. 1992).

Schiesser, et al., "Micro Dynamic Solder Pump: Drop on Demand Eutectic Solder Dispensing Device," *Proceedings of Surface Mount Int'l*, San Jose, CA, pp. 501–509 (Aug. 1994).

Demonstration flyer entitled "Demonstration—IBM Micro-Dynamic Solder Pump," *IBM Corporation*, Austin, TX (received at Surface Mount Int'l Proceedings in San Jose, CA on Aug. 30–31, 1994).

Vest, et al., "Ink Jet Printing of Hybrid Circuits," *Int. Journal for Hybrid Microelectronics*, vol. 6, pp. 261–267 (1983).

Wallace, D. B., "Automated Electronic Circuit Manufacturing Using Ink–Jet Technology," *Journal of Electronic Packaging*, vol. 111, pp. 108–111 (Jun. 1989).

Teng, K. F. and Vest, R., "Metallization of Solar Cells with Ink Jet Printing and Silver Metallo–Organic Inks," *IEEE Trans. on Components, Hybrids, and Mfg. Technology*, vol. 11, pp. 291–297 (Sep. 1988).

Teng, K. F., "Ink Jet Printing in Thick Film Hybrid Microelectronics," *Dissertation Abstracts Int'l*, vol. 48, p. 225–B (Jul. 1987).

Travis, J., "Making Materials that Are Good to the Last Drop," *Science*, vol. 258, p. 1307 (Nov. 1992).

*Primary Examiner*—William A. Cuchlinski, Jr.
*Assistant Examiner*—Lisa Douglas
*Attorney, Agent, or Firm*—Arnold, White & Durkee

[57] ABSTRACT

Apparatus and methods for making uniformly-sized and predictably-spaced droplets from high-temperature liquids. Liquid droplet generators having electromechanical driving elements are coupled to a power supply to apply pulsed excitation forces through a wall of a delivery tube to a high-temperature liquid, e.g., a liquid metal, epoxy, or polymer. The excitation forces generated by the driver induce capillary vibrations in the liquid within the delivery tube. Liquid jet streams having capillary vibrations when exiting an orifice break up into groups of substantially uniformly-sized liquid droplets shortly after leaving the orifice. Droplets may be produced in a uniformly-spaced series, or individually on demand in response to a single burst of force from the driving element. A heat source is also thermally coupled to the delivery tube to maintain the liquid in a high-temperature state. Embodiments using heat-sensitive elements thermally insulate those elements from the wall of the heated delivery tube and may also actively cool the elements by one or more heat exchangers. A magnetohydrodynamic embodiment couples a magnetic field, having spaced points of maximum intensity, to a fluid stream exiting an orifice, causing the stream to break into droplets in response to the periodic magnetic field.

42 Claims, 11 Drawing Sheets

U.S. PATENT DOCUMENTS

| | | | |
|---|---|---|---|
| 3,832,579 | 8/1974 | Arndt | 310/8 |
| 3,952,921 | 4/1976 | Tanner | 222/146 |
| 3,958,249 | 5/1976 | DeMaine et al. | 239/102.2 |
| 3,972,474 | 8/1976 | Keur | 239/102 |
| 4,035,116 | 7/1977 | O'Brien et al. | 425/10 |
| 4,243,995 | 1/1981 | Wright et al. | 310/345 |
| 4,406,405 | 9/1983 | Marichy | 239/102.2 |
| 4,418,354 | 11/1983 | Perduijn | 346/140 |
| 4,467,236 | 8/1984 | Kolm et al. | 310/331 |
| 4,511,600 | 4/1985 | Leas | 427/75 |
| 4,523,202 | 6/1985 | Gamblin | 239/102.2 |
| 4,527,717 | 7/1985 | Emoto et al. | 222/593 |
| 4,619,845 | 10/1986 | Ayers et al. | 427/422 |
| 4,689,515 | 8/1987 | Benndorf et al. | 239/102.2 |
| 4,736,704 | 4/1988 | Henninger | 118/688 |
| 4,774,037 | 9/1988 | Hendricks | 264/9 |
| 4,828,886 | 5/1989 | Hieber | 427/422 |
| 4,853,317 | 8/1989 | Hayes | 430/318 |
| 4,891,242 | 1/1990 | Ito et al. | 427/53.1 |
| 4,925,103 | 5/1990 | Muench et al. | 239/79 |
| 4,991,287 | 2/1991 | Piatt et al. | 29/840 |
| 5,004,130 | 4/1991 | Vaterlaus | 222/590 |
| 5,008,582 | 4/1991 | Tanuma et al. | 310/330 |
| 5,103,763 | 4/1992 | Goldowsky et al. | 239/102.2 |
| 5,132,248 | 7/1992 | Drummond et al. | 431/173 |
| 5,152,457 | 10/1992 | Burwell et al. | 239/102.2 |
| 5,154,347 | 10/1992 | Vijay | 239/102.2 |
| 5,196,667 | 3/1993 | Gammelin | 239/135 |
| 5,229,016 | 7/1993 | Hayes et al. | 222/590 |
| 5,248,087 | 9/1993 | Dressler | 239/102.2 |
| 5,266,098 | 11/1993 | Chun et al. | 75/335 |

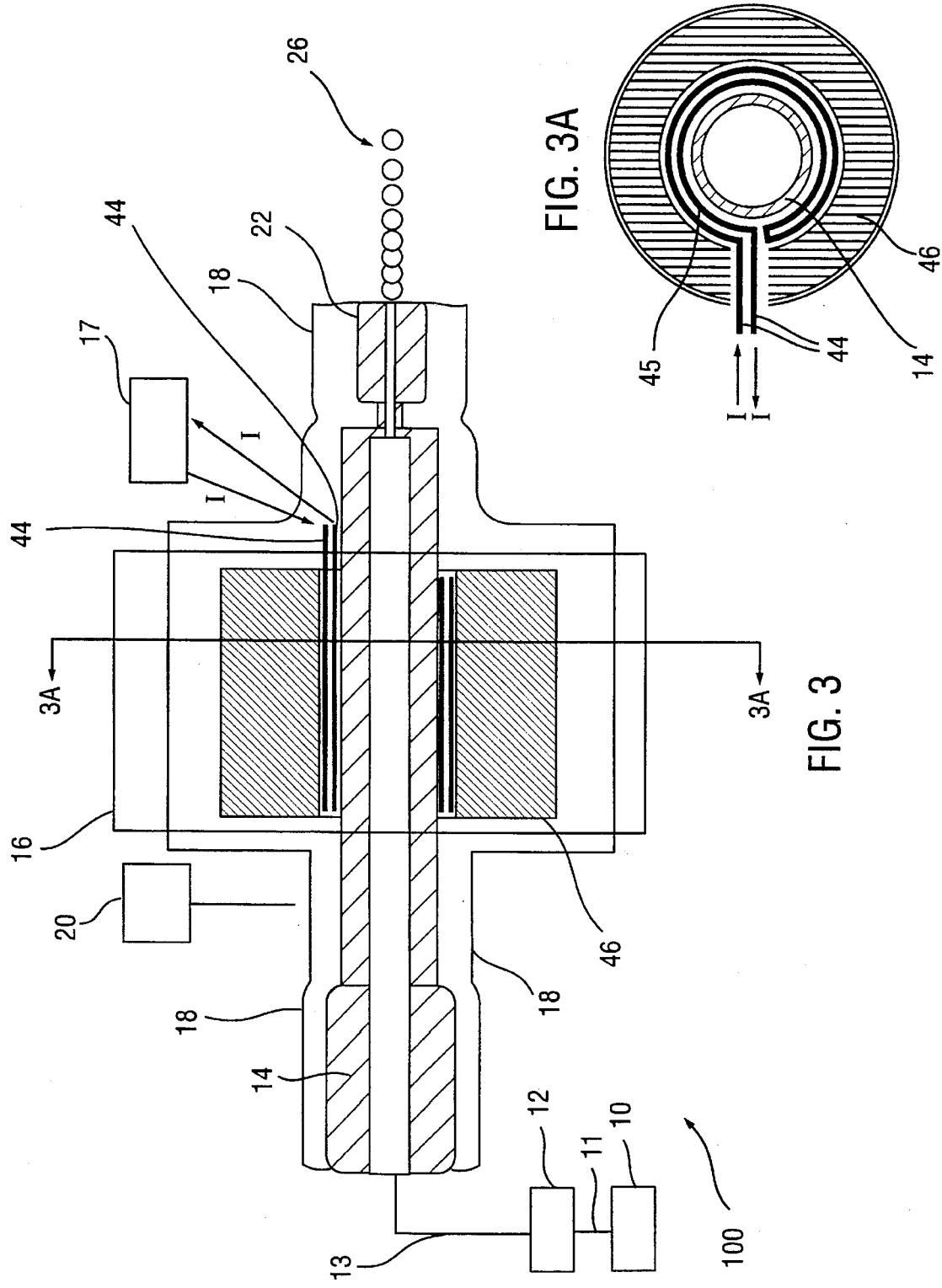

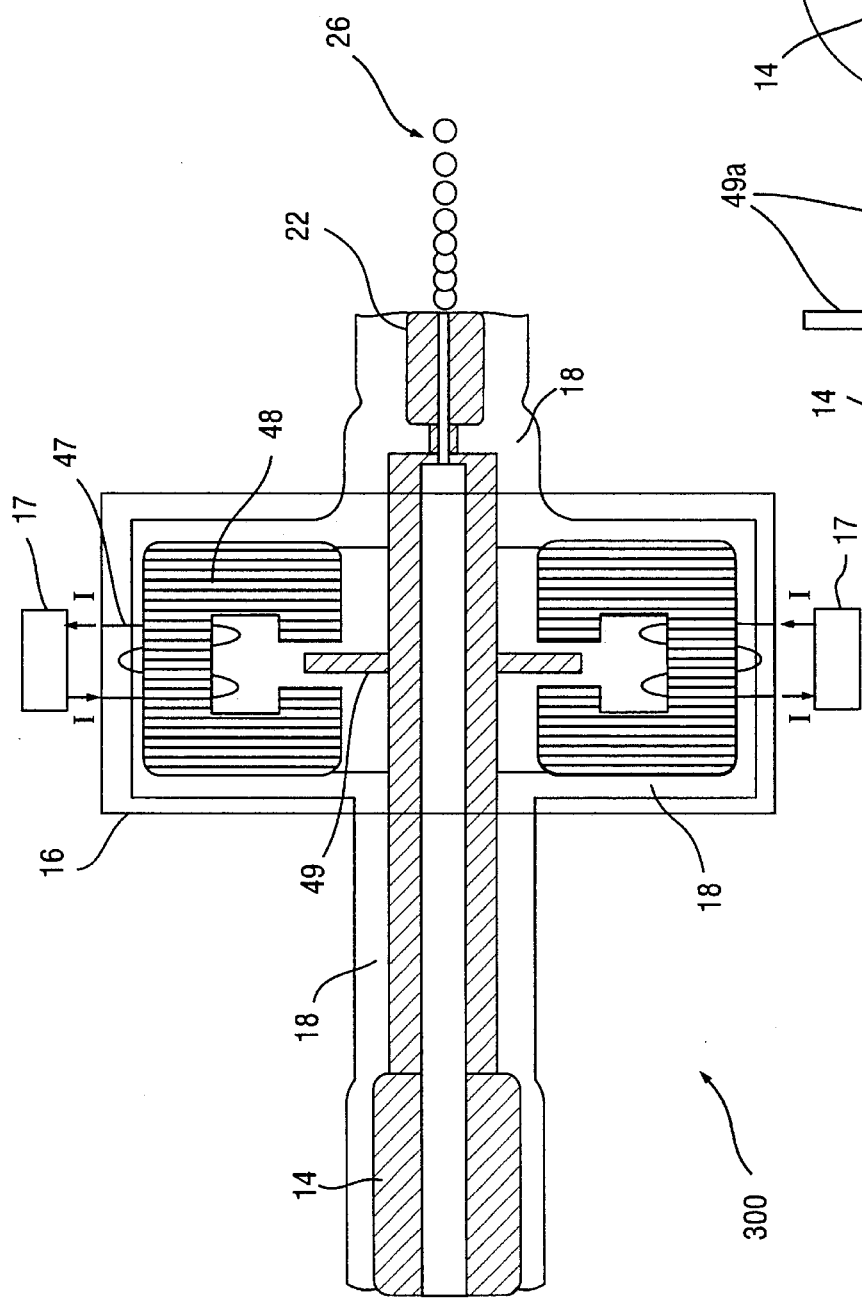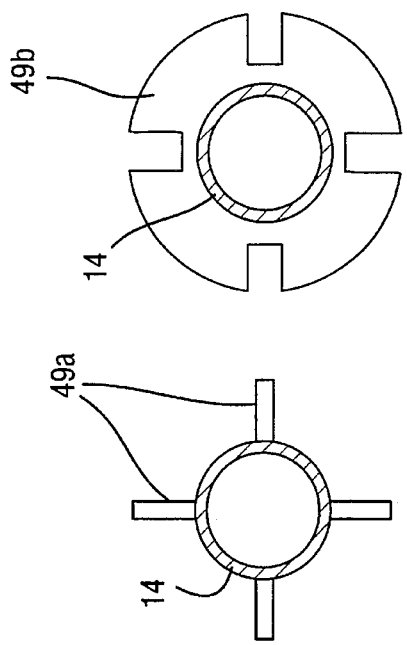

HEAT-RESISTANT BROAD-BANDWIDTH LIQUID DROPLET GENERATORS

BACKGROUND

The invention relates to methods and apparatus to produce uniformly-sized liquid droplets, particularly for use in deposition techniques using droplets of high-temperature liquids.

Liquid expelled as a jet stream flowing through a small (capillary) orifice under constant pressure tends to break up into droplets of non-uniform size and spacing. If ultrasonic vibrations of suitable frequency are induced in the liquid jet stream, pressure oscillations will propagate through the jet stream. Amplification of capillary waves in the liquid jet stream will cause the size and spacing of droplets formed in the expelled jet stream to become more uniform.

Vibrations may be induced in the liquid jet directly by tuning forks or other mechanical vibrators, or through forces induced by electromagnetic fields or piezoelectric driving elements that are coupled to the fluid jet stream through the walls of a containment vessel. Systems in which movement of the liquid jet stream through the orifice and application of the vibration are substantially uninterrupted are said to operate in a continuous mode.

Droplets may also be generated when a pressure pulse is applied to a static liquid in a vessel with one or more orifices. In such a system, no liquid flow occurs in the absence of a pressure pulse. However, when the liquid is subjected to a brief controlled pressure pulse, the resulting volumetric change in the fluid causes pressure/velocity transients to occur in the fluid. These transients in turn force a droplet of predictable size to issue from an orifice. Because a droplet is produced only when a pressure pulse is applied to the liquid, such a system is said to operate in a drop-on-demand mode.

In certain manufacturing processes, it is desirable to produce metal drops of a known, and perhaps uniform, size. Liquid metal systems operating in a continuous or drop-on-demand mode for droplet production have been described in U.S. Patents (e.g., U.S. Pat. Nos. 5,266,098 to Chun et al.; 5,229,016 to Hayes et al.; 3,683,212 to Zoltan; 4,527,717 to Emoto et al.; and 4,828,886 to Hieber, the disclosures of all of are incorporated herein by reference).

Droplet generators having magnetostrictive or piezoelectric driving elements (see Chun et al., Hiebet, and Zoltan) are generally limited to low melting-point metals and metal mixtures (70°–200° C.) in liquid metal applications because magnetostrictive or piezoelectric driving elements lose their responsive properties at temperatures greater than the Curie temperature of the material in question (about 350° C. for typical piezoelectric materials such as lead zirconium titanate (PZT). Thus, droplet generators using piezoelectric or magnetostrictive driving elements have not been successful in systems using high-temperature solders or metals such as copper (melting point 1083° C.).

Because droplet generators suitable for drop-on-demand or continuous service with high-temperature liquids have not been able to use piezoelectric driving elements, mechanical systems of valves or pistons have been favored instead. Mechanical generators can be made relatively heat tolerant; however, their mechanical linkages result in more limited frequency response than that obtainable with magnetostrictive or piezoelectric elements. Known high-temperature droplet generators operate at much lower frequencies and narrower bandwidths than those obtainable in low-temperature systems with piezoelectric driving elements. Thus, a need exists for broad-bandwidth droplet generators for use with high-temperature liquids.

SUMMARY OF THE INVENTION

The problems outlined above are addressed by the devices and methods of the present invention. Broadly stated, the present invention relates to heat-resistant, broad-bandwidth droplet generators comprising electrically excited electromechanical, magnetostrictive, magnetohydrodynamic and/or piezoelectric driving elements suitable for use in either continuous or drop-on-demand modes with high-temperature liquids (such as molten metals).

The present invention provides a method and apparatus for emitting individual spherical particles (droplets) of high-temperature liquid from an orifice in a delivery tube of small diameter. For purposes of the present invention, "high temperature" is considered to represent temperatures above about 350° C. Of course, the method and apparatus of the present invention will produce droplets in a novel manner even with liquids of much lower temperatures, such as room temperature or less. It is preferred that the high-temperature liquid be maintained at its desired high operating temperature while within its delivery tube. In several preferred embodiments, a driving element applies a force to the delivery tube ("direct coupled") in response to droplet generating instructions. In another preferred embodiment, a driving element acts directly on a liquid jet stream of a conductive material emitted from the delivery tube.

For direct coupled embodiments, both continuous and drop-on-demand systems are provided. In a continuous jet system, a liquid jet stream preferably travels through the delivery tube from a pressurized source. The driving element provides pulsed forces to the delivery tube to induce a perturbation on the liquid jet stream travelling through the tube. Droplets are formed from the jet, which issues from the delivery tube through an exit orifice at a certain velocity. A stream of discrete droplets results, having a frequency corresponding to the frequency of the energy pulses on the delivery tube.

For drop-on-demand jets, the high-temperature liquid is stationary in an optimized (tuned) fluid chamber within the delivery tube. In response to droplet generating instructions, the driving element produces a single force on the delivery tube, large enough to cause a single liquid droplet are to be expelled from the exit orifice. It is preferred that the volume of the fluid chamber be such as to optimally convert mechanical force and energy into velocity and kinetic energy of the ejected droplet.

Droplets produced according to the present invention may be captured passively as balls, and travel toward pre-positioned targets or are directed thereto by in-flight guidance forces (e.g., by electrostatic or electromagnetic fields altering droplet flight paths).

Where high-temperature liquids are used, a heat source is preferably coupled to the liquid chamber or delivery tube to maintain the liquid in its heated state. A heat source for the tube may be one or more heaters coupled thereto or liquid within the tube or vessel which is heated by other means, such as by an inductive heater or resistively through other means. In addition, the droplet generator itself may be placed in a high-temperature environment, such as in a heated chamber.

Application of high-temperature liquid droplets remotely in the form of droplets has the advantage that physical contact with the surfaces to be wetted does not occur. This is of importance especially for heat sensitive areas and very small areas, as on a typical circuit board. Thus, it is desirable that the droplets be accurately positioned. By a suitable choice of the number of drops to be applied, it is possible to apply an accurately defined quantity of liquid (such as molten metal) to a surface. Thus, it is also desirable to produce liquid drops of a highly consistent volume, shape, and spacing.

The present invention contemplates several embodiments of continuous-mode driving elements that induce vibrations in a fluid jet stream in a delivery tube. The vibrations cause the jet stream to break up into uniformly-sized and uniformly-spaced droplets upon exiting an orifice coupled to the delivery tube.

The present invention also contemplates several embodiments of drivers for drop-on-demand droplet generators. These drivers receive a single burst of a suitable signal (e.g. current or voltage) and translate that burst into a force or pressure pulse that acts upon a tuned fluid chamber to expel a certain quantity of liquid from an orifice coupled to the fluid chamber. In such embodiments, the tuned fluid chamber is preferably bounded at one end by the exit orifice, and at its other end by a flow-restricting orifice. The flow-restricting orifice serves to prevent an excessive quantity of liquid from flowing backwards away from the exit orifice. The flow-restricting orifice may comprise, for example, a nozzle having an opening much smaller than the internal diameter of the fluid chamber, a one-way valve, or other suitable mechanism.

In yet another embodiment, a driver is provided that does not act upon the fluid delivery chamber, but instead provides a magnetic field that acts directly upon the ejected liquid jet stream, wherein the liquid is a conductive material. The magnetic field has regularly-spaced points of maximum field intensity that induce the jet stream to break into droplets of a spacing that corresponds to the spacing between the maximum field-intensity points.

Driving Elements

According to one aspect of the present invention, electromechanical driving elements in droplet generators of the present invention induce vibrations in the fluid jet stream by employing forces on a delivery tube in one of several manners: (1) between electric currents maintained or induced on suitable mechanical structures; (2) between currents and suitable magnetic materials, which form part of the mechanical structure; and (3) based on magnetostriction or piezoelectric effects acting on the wall of the delivery tube (compressing the tube).

According to another aspect of the present invention, magnetohydrodynamic effects may also be employed on an electrically conductive liquid (metal) after it exits the delivery tube. Magnetohydrodynamic effects require the application of magnetic fields to directly act upon the conductive liquid. The variations in the magnetic field will cause a perturbation on the liquid jet stream, causing the jet stream to break up into droplets of a spacing that corresponds to the spacing between points of maximum field intensity.

A liquid droplet generator according to one broad aspect of the present invention thus comprises a delivery tube having a wall and an exit orifice, an electromechanical, magnetostrictive, or piezoelectric driver element coupled to the wall for vibrating said tube, a power supply coupled to the driver, and a heat source for heating said delivery tube. The heat source may be coupled to the delivery tube and substantially surround the delivery tube. A temperature controller may also be provided to control the heat source.

Alternatively, the heat source may comprise a heated chamber adapted to receive the droplet generator. The internal diameter of the exit orifice is preferably smaller than the internal diameter of the delivery tube.

According to a preferred method of generating liquid droplets according to the present invention, the power supply provides pulsed power to the driver at a frequency corresponding to a desired spacing between droplets generated by the droplet generator. A liquid is delivered to a liquid droplet generator having an electromechanical driver element coupled to the delivery tube. The driver element is electrically excited by the power supply to act upon the wall of the delivery tube, resulting in a series of pressure pulses that cause liquid droplets to form from the jet issuing from the orifice. Alternatively, according to another preferred embodiment, the power supply provides a single pulse of power on demand, forcing a single droplet to issue from the delivery tube in response to that pulse. To prevent an excessive quantity of liquid travelling away from the exit orifice in response to the pulse, the drop-on-demand droplet generator preferably also comprises a flow-restricting orifice disposed within the delivery tube defining a tuned fluid chamber in the tube bounded by the flow-restricting orifice at a first end and by the exit orifice at a second end.

According to one preferred embodiment of the present invention, the electromechanical driver element comprises current windings circumferentially surrounding the tube and acoustically coupled thereto. The current windings are also coupled to the power supply. Electrical insulation is disposed between adjacent current windings. The windings are disposed so that a current travelling through a first winding will be of opposite polarity to a current travelling through an adjacent winding. A force retaining ring is also provided that substantially surrounds the current windings and translates the opposing current forces to pressure pulses that act on the delivery tube.

According to a preferred method of the present invention, a pulsed current is supplied to the current windings, which generates opposing current forces surrounding the delivery tube, thus acting upon the wall of the delivery tube in response to the opposing current forces. In response to the forces, a perturbation is induced in the liquid in the delivery tube. The physics of the jet amplifies the perturbations, causing the jet to break into droplets after exiting the delivery tube through the orifice.

According to yet another preferred embodiment of the present invention, the electromechanical driver element comprises an electromagnetic field generator substantially surrounding the delivery tube, and an armature circumferentially coupled to the delivery tube. The electromagnetic field generator comprises an electromagnetic coil having current windings coupled to the power supply. The armature preferably comprises soft magnetic material, such as steel. According to one aspect of the present invention, the armature comprises symmetrically spaced tabs. According to an alternative aspect of the present invention, the armature comprises a notched ring, with the notches being symmetrically spaced. Other suitable configurations of the armature will be apparent to those of skill in the art.

In a preferred method according to the present invention, pulsed current is supplied to the current windings of an electromagnetic coil, generating a pulsed magnetic field substantially and symmetrically surrounding the delivery tube in response to the pulsed current. A portion of the wall of the delivery tube is alternately expanded and contracted radially in response to the pulsed magnetic field forces, acting upon the liquid in the delivery tube in response to the expansion and contraction, and inducing a perturbation on the liquid in the delivery tube in response to the forces. Amplifying the waveform causes the liquid to break into droplets upon exiting the orifice.

A dimension-changing means such as a magnetostrictive element may be part of the driving element, whereby the magnetostrictive element is acoustically coupled to the wall and thermally insulated from the wall. The magnetostrictive element is excited by a magnetic field through application of pulsed current. The magnetostrictive element changes dimension (alternately expands and contracts) in response to the pulsed field, thus acting upon the liquid in the delivery tube in response to the expansion and contraction forces. These forces in turn will induce a perturbation on the liquid in the delivery tube in response to the vibrations. The physics of the jet amplify the perturbations, causing the jet to break into droplets after exiting the delivery tube through the orifice.

For applications involving high-temperature liquids, it is preferred that the magnetostrictive element be insulated from the delivery tube and cooled. Thus, according to yet another preferred embodiment of the present invention, the electromechanical driver element comprises an insulator coupled to the delivery tube and circumferentially surrounding the tube over a portion of the length of the tube. The insulator preferably comprises an acoustically conductive, thermally insulating material. The driver also comprises a first conductor substantially surrounding the insulator and coupled thereto and also coupled to the power supply. A magnetostrictive element is coupled to said first conductor, and a force retaining ring of electrically conductive material substantially surrounds the magnetostrictive element and is coupled thereto and is also coupled to the power supply.

To prevent the magnetostrictive element from becoming overheated in response to high-temperature liquids moving through the delivery tube, cooling means are disposed to draw heat away from said first conductor and said force retaining ring. The cooling means may comprise a thermal electric tap ring coupled to the first conductor and the force retaining ring, and a heat conduit coupled to the tap ring. Heat may be extracted longitudinally from the thermal electric tap ring to one or more suitable heat sinks via the heat conduit. Suitable conductors include copper, silver, platinum, and various alloys. Heat sinks may be accomplished by traditional methods known to those of skill in the art, including convective fluids, heat pipes, evaporative heat transfer, and thermal electric refrigeration.

According to another aspect of the present invention, a dimension-changing means such as a piezoelectric crystal is used to generate the droplet-generating vibrations. A power supply provides pulsed voltage to conductors surrounding the piezoelectric crystal. This voltage pulse is transmitted through the conductors to the piezoelectric crystal, which changes its dimensions (e.g., contracts or expands) in response. This force is coupled through an acoustical conductor to the fluid delivery tube. This in turn results in a perturbation on the fluid jet stream in the delivery tube, causing the jet stream to break into uniformly-sized and uniformly-spaced droplets shortly after exiting the orifice.

A piezoelectric driver may also be used in a drop-on-demand droplet generator, whereby a single voltage pulse causes a single force or pressure pulse to be transmitted from the piezoelectric crystal to a tuned fluid chamber. A certain quantity of liquid will thus be expelled from the fluid chamber.

It is preferred that the piezoelectric crystal be cooled in a manner as described above for a magnetostrictive element.

According to yet another preferred embodiment of the present invention, the liquid droplet generator comprises a delivery tube having a wall and an exit orifice, wherein the delivery tube is adapted to transmit a pressurized liquid jet stream of conductive material through the exit orifice. An electromagnetic driver element is disposed to receive the liquid jet stream from the exit orifice. The driver element in turn comprises a magnetic field yoke having arms corresponding to points of maximum magnetic field intensity, and current windings disposed about a portion of the magnetic field yoke. A power supply is coupled to the current windings of the driver element. To maintain the contents of the delivery tube in a heated state, a heat source is also provided for heating the delivery tube in the manner described above.

In yet another preferred method according to the present invention, droplets of a conductive liquid are generated by delivering liquid under pressure to a liquid droplet generator, wherein the driver acts directly on the liquid expelled from the delivery tube. Current is supplied to the driver element which generates a magnetic field having spaced points of maximum field intensity. The liquid jet stream is propelled from the delivery tube and through this magnetic field. The magnetic field acts upon the emitted jet stream of conductive liquid, generating a disturbance in the jet stream that causes the jet stream to break up into a series of droplets in response to the magnetic field, the droplets having a spacing corresponding to the spacing of the points of maximum field intensity.

In short, the present invention provides novel apparatus and methods for making uniformly-sized and predictably-spaced droplets from high-temperature liquids. In several preferred embodiments, the liquid droplet generators have electromechanical driving elements coupled to a power supply to apply excitation forces through a wall of a delivery tube to a high-temperature liquid, e.g., a liquid metal. The excitation forces (pressure pulses) generated by the driver induce capillary vibrations in the liquid issuing from the orifice. In response to those capillary vibrations, the liquid jet stream breaks up into substantially uniformly-sized liquid droplets shortly after leaving an orifice in the delivery tube. Droplets may be produced in a uniformly-spaced series, or in single droplets on demand in response to a single burst of pressure from the driving element. Alternatively, droplets may be generated from a jet stream of a conductive material by applying directly to the stream a periodic magnetic field having spaced points of maximum intensity.

Droplet Generating System

In a liquid-droplet generation system according to the present invention, a high-temperature liquid (such as liquid metal, solder, various polymers, epoxies, etc.) is supplied from a supply tank through a pump, which in turn pumps the liquid to a delivery tube. According to a preferred embodiment of the present invention, the delivery pump is gas-pressured. Suitable delivery tube materials include aluminum, stainless steel, molybdenum, graphite, tantalum, and ceramic. Stainless steel and molybdenum are preferred delivery-tube wall materials according to the present invention. To keep the liquid in a heated or melted state, a heater is coupled to the delivery tube. A temperature controller may be provided to regulate the temperature of the heater.

A driver acts to create droplets from the high-temperature liquid, either continuously or on demand, in one of several manners described above. A power supply provides necessary power to the driver, either in pulses at a frequency selected according to the spacing desired between droplets or in single bursts on demand. For precise placement on a target (such as a circuit board), the droplets may be selectively charged by a charge electrode in response to, for example, a CAD/CAM input. Selectively charged droplets are then passed through a voltage field, which causes selective deflection of the droplets to a desired position on a target.

Sequential and Simultaneous Force Applications

Electromechanical driving elements of the present invention have characteristic frequency responses and force capabilities. Two or more driving elements of the same or different type may be arranged to be activated sequentially or simultaneously to produce desired force profiles in contained liquids.

In addition, feedback control may be employed in preferred embodiments to alter the timing and force profiles of an individual driving element, or of all driving elements acting on a liquid sequentially or simultaneously.

The advantages of the present invention will be further appreciated from the drawings and from the detailed description provided below.

BRIEF DESCRIPTION OF THE DRAWINGS

The herein described advantages and features of the present invention, as well as others which will become apparent, are attained and can be understood in more detail by reference to the following description and appended drawings, which form a part of this specification.

It is to be noted, however, that the appended drawings illustrate only exemplary embodiments of the invention and are therefore not to be considered limiting of its scope, for the invention may admit to other equally effective embodiments.

FIG. 3 is a schematic representation of a continuous, electromechanical droplet generator using current-to-current excitation means according to the present invention.

FIG. 3A is a cross-section along plane 3A—3A of FIG. 3.

FIG. 5 is a schematic representation of a continuous, electromechanical direct-coupled droplet generator using current-to-magnetic-material excitation according to the present invention.

FIG. 5A is a cross-sectional view of an armature having symmetrically spaced tabs.

FIG. 5B is a cross-sectional view of an armature having symmetrically spaced notches.

DETAILED DESCRIPTION OF TEE PREFERRED EMBODIMENTS

Figure 1:
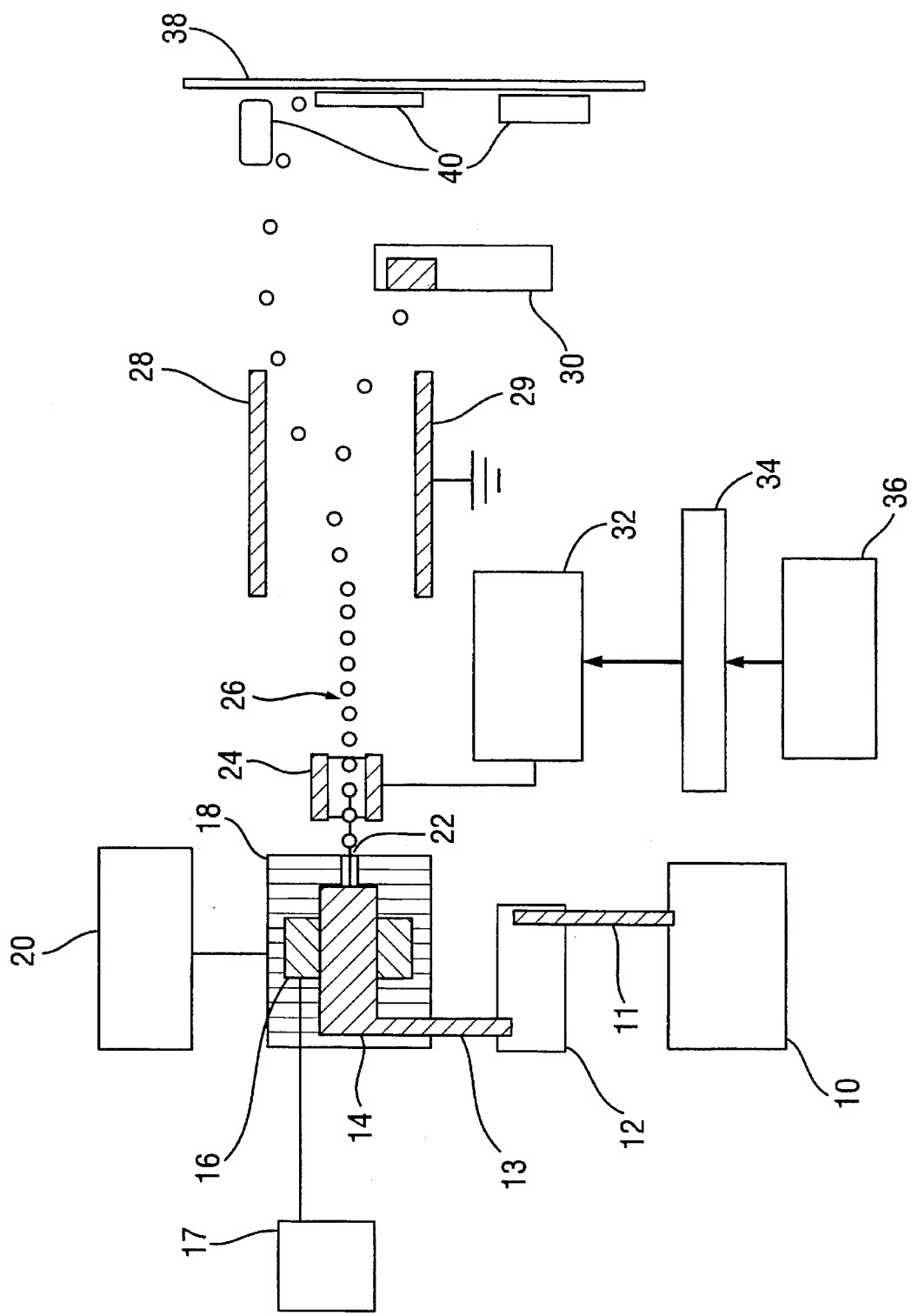
FIG. 1 is a schematic representation of a continuous-type droplet generation system according to the present invention.

Turning now to the figures, FIG. 1 is a schematic representation of a continuous droplet generation system according to the present invention. A liquid (such as liquid metal, solder, epoxy, etc.) is supplied from supply 10 through conduit 11 to pump 12, which in turn pumps the liquid through conduit 13 to delivery tube 14. Pump 12 may be gas-pressured to deliver the liquid to delivery tube 14 and through the tube to orifice 22. A suitable gas to be used with a gas-pressured pump is clean, dry nitrogen under a pressure of about 100 psi. Argon is another exemplary gas. Suitable delivery tube materials include aluminum, stainless steel, molybdenum, tantalum, graphite, and ceramics. Stainless steel and molybdenum are preferred delivery tube materials according to the present invention based on their cost, compatibility with high temperatures, and machinability.

For use with high-temperature liquids, it is preferred that the system include heater 18 thermally coupled to delivery tube 14 to keep the liquid in a heated state (or melted state, for metals and solders). Temperature controller 20 may be used to regulate the temperature of heater 18, which is shown in FIG. 1 as substantially surrounding delivery tube 14. Other arrangements for heater 18 will be apparent to those of skill in the art, such as infrared heaters, induction heaters, ovens, etc. In some embodiments, as depicted in subsequent figures, it is preferred that driving element 16 be isolated from heater 18.

Driver 16 acts upon delivery tube 14 to excite the liquid jet stream travelling through delivery tube 14 and induce a waveform thereon, thus causing the liquid jet stream, upon exiting delivery tube through orifice 22, to break into a series of liquid droplets 26. Power supply 17 supplies necessary power to driver 16 in pulses at a frequency selected according to the spacing desired between droplets 26.

The exact size of the droplets is a function of the liquid jet diameter (d), the liquid jet velocity (V), and the frequency of the imposed vibrations (f). The diameter D of the droplets is determined primarily from the diameter of the exit orifice (d), but also is a function of the jet velocity.

$$D = \sqrt[3]{\frac{3d^2 V}{2f}} \quad (1)$$

For precise placement on a target (such as circuit board 38), the droplets 26 may be selectively charged by charge electrode 24. CAD/CAM input 36 provides, for example, character data 34 that is fed to charge driver 32. Charge driver 32, in turn, is coupled to charge electrode 24 to selectively charge drops from droplet stream 26. The charged droplet stream is then passed between high voltage plate 28 and grounded plate 29. The voltage field causes selective deflection of the droplets. Uncharged droplets are caught by catcher 30, whereas charged droplets are deposited in appropriate locations on circuit board 38. Alternatively, where static charge build-up can damage sensitive devices, charged droplets may be caught by catcher 30, with the uncharged droplets allowed to proceed to the target. Droplets 26 may be used, for example, to attach circuit components 40 to circuit board 38.

Figure 2:
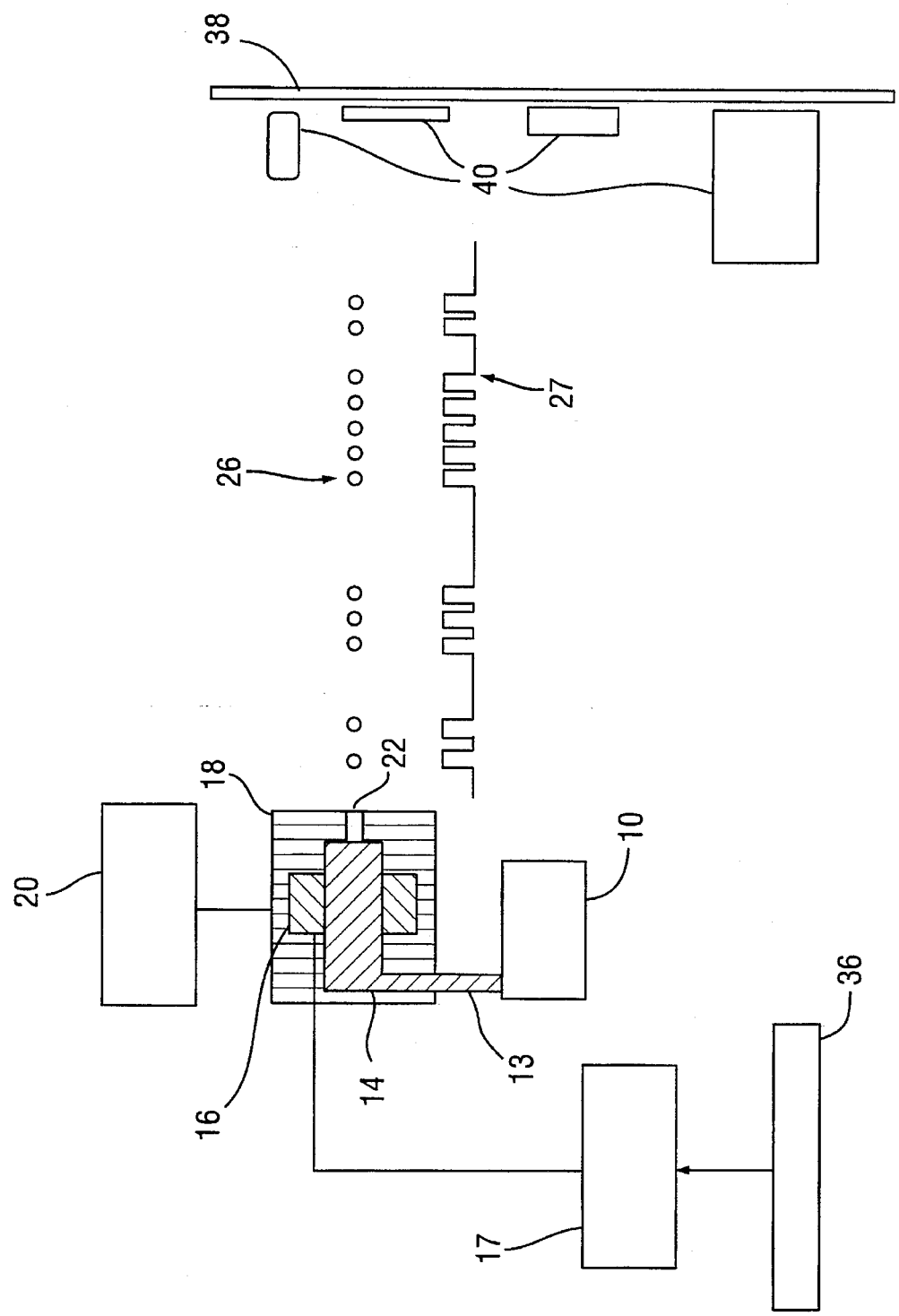
FIG. 2 is a schematic representation of a drop-on-demand droplet generation system according to the present invention.

The droplet generating system of the present invention may also function in a drop-on-demand mode, as illustrated in FIG. 2. A liquid is supplied from supply tank 10, which is preferably gas-pressured. The liquid remains stationary in delivery tube 14 in the absence of an external force. Power supply 17 may be pulsed in response to, for example, CAD/CAM data 36. In response to each pulse, driver 16 provides a force that acts upon the liquid in delivery tube 14 to deliver a single droplet of liquid through orifice 22. CAD/CAM data is shown in FIG. 2 as generating data pulse train 27. Droplets 26 correspond to that data pulse train. These droplets are then applied to a target, such as circuit board 38, where they may be used, for example, to solder circuit components 40 to circuit board 38. The target itself may be selectively moved so that each droplet will land on the appropriate area.

Several preferred embodiments of drivers 16 for droplet generators according to the present invention are discussed below.

Current-to-Current Excitation Continuous Mode

Droplet generator 100 of FIG. 3 comprises delivery tube 14 with heat source 18 preferably positioned and operated to maintain the contents of tube 14 in a heated (liquid) state. Heater 18 is shown in FIG. 3 as surrounding delivery tube 14 and driver 16. Heater 18 may comprise, for example, ¾" heat tape such as that produced by Conrad Industries of Columbus Ohio, which is powered by a 120 V power supply, not shown. Heater 18 may be coupled to temperature controller 20. Alternatively, droplet generator 100 may be placed in a heated chamber, which will obviate the need for separate heater 18.

Tube 14 terminates in an orifice 22 through which liquid contents of tube 14 may be forced to emerge in droplet form. Tube 14 is preferably made of non-wettable metal, such as 316 stainless steel. Orifice 22 may comprise, for example, a jewelled (sapphire, ruby, etc.) orifice such as that manufactured by Byrd Precision, Waltham, Mass. The internal diameter of tube 14 is preferably greater than the internal diameter of orifice 22. This facilitates the delivery of the fluid to the orifice.

Driver 16 in the embodiment depicted in cross-section in FIG. 3 operates on current-to-current excitation principles, and is detailed in FIG. 3A, which is a cross-section of driver 16 along plane 3A—3A. As shown in FIG. 3A, pulsed current (I) from a current source (power supply 17) enters conductive strip 44 as indicated. The current then traverses through conductive strip 44 and exits as shown. Conductive strip 44 may be any conductive material that can withstand high temperatures, such as copper or platinum foil. Sandwiched in between windings of conductive strip 44 is insulating material 45. A suitable insulating material is ceramic woven tape such as that produced by Cotronics Corp., Brooklyn, N.Y.

Power supply 17 supplies pulsed current to strip 44, preferably in the range of several hundred to over 1,000 amps at very low voltage, i.e., less than 1 volt. Because strip 44 is wound back upon itself, opposing, pulsed current forces are generated that tend to cause the windings of the strip to repel against each other. These opposing forces are contained by force retention member 46, which is an acoustically-tuned, force retaining ring that may be comprised of stainless steel, for example. This results in acoustic waves, which are echoed as pressure pulses back toward the center of delivery tube 14, where the pulses in turn cause the pressure and velocity of the liquid jet stream in delivery tube 14 to vary. This variance generates capillary waves on the liquid jet stream, which ultimately cause the jet stream to break into regularly-sized and regularly-spaced droplets upon exiting orifice 22. The spacing of the droplets may be predicted accurately from the frequency of the pulsed current source. The size of the droplets may also be predicted accurately if the velocity of the liquid jet stream and the internal diameter of orifice 22 is known in addition to the frequency of the pulsed current source. (See Eq. 1.)

Drop-on-Demand Mode

Figure 4A:
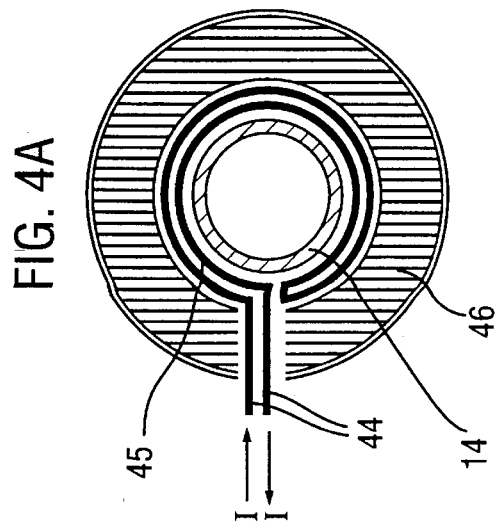
FIG. 4A is a cross-section along plane 4A—4A of FIG. 4.
Figure 4:
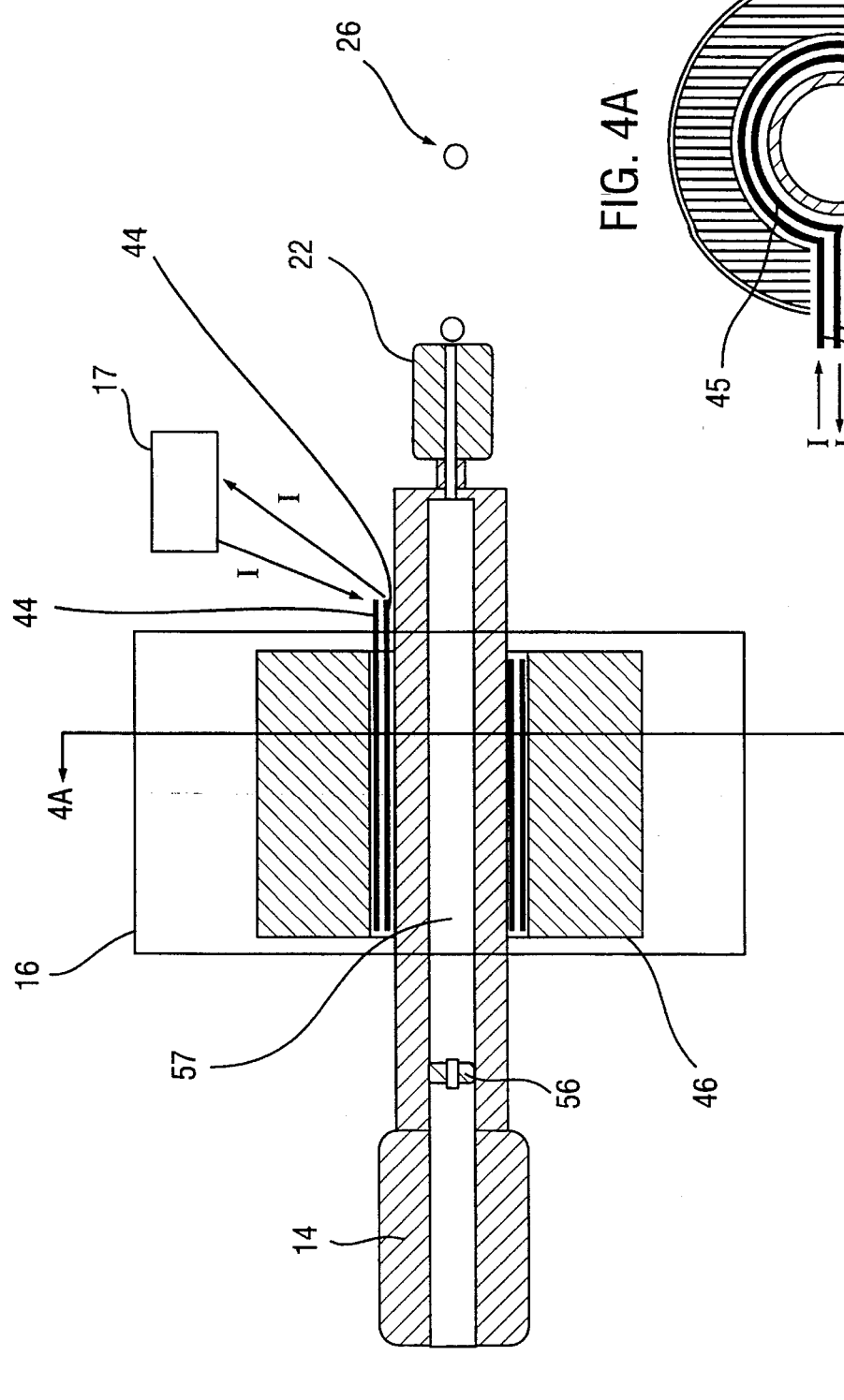
FIG. 4 is a schematic representation of a drop-on-demand electromechanical droplet generator using current-to-current excitation according to the present invention.

FIG. 4 is a schematic representation of a drop-on-demand electromechanical droplet generator using current-to-current excitation according to the present invention. Droplet generator 200 operates on the same basic principles as described for droplet generator 100 of FIG. 3. However, single droplets are produced on demand instead of a continuous stream of regularly spaced droplets. Power supply 17 supplies a single, large pulse of current on demand to driver 16. The current pulse enters conductive strip 44 of driver 16, a cross-section of which is shown in FIG. 4A. Opposing current forces are created as described above. This results in a large, single force that is reflected by acoustic retaining ring 46 toward tuned fluid chamber 57 as a pressure pulse. This pulse in turn causes a quantity of liquid to be moved through fluid chamber 57 and to be expelled from orifice 22, which is coupled to tuned fluid chamber 57. Surface tension on the liquid causes the liquid to assume a spherical shape (droplet) within a brief period after exiting orifice 22.

Flow restricting orifice 56 positioned within delivery tube 14 creates tuned fluid chamber 57 between orifice 56 and exit orifice 22. Flow restricting orifice 56 prevents an excessive quantity of liquid to be ejected from tuned fluid chamber 57 in a direction opposite to the desired direction (i.e., through orifice 22). The quantity of liquid ultimately expelled through orifice 22 may be predicted from the change in the volume of tuned fluid chamber 57, internal diameter of orifices 22 and 56, and from the size of the current pulse applied from power supply 17 to driver 16. It is preferred that the volume of the fluid chamber be such as to optimally convert mechanical force and energy into velocity and kinetic energy of the ejected droplet.

It is also preferred that a heat source (not shown in FIG. 4) be provided to maintain the contents of delivery tube 14 in a heated state, as shown in FIG. 3.

Electromechanical Direct-Coupled Excitation Continuous Mode

FIG. 5 is a schematic representation of a continuous, electromechanical direct-coupled droplet generator 300 using current-to-magnetic-material excitation according to the present invention. Driver 16 comprises electromagnetic coil yoke 48 (shown in cross section in FIG. 5), which may comprise a single coil, or a plurality of coils placed in symmetrical spacing about the circumference of delivery tube 14. Electromagnetic coil yoke 48 is preferably comprised of soft magnetic steel. Coil yoke 48 is gapped to receive armature 49. As shown in FIG. 5A, armature 49 may comprise, for example, tabs 49a of soft magnetic material coupled to the exterior of delivery tube 14. Another suitable embodiment for armature 49 is notched ring 49b (FIG. 5B) coupled to the exterior of delivery tube 14. It is preferred that the tabs or notches be symmetrical about the circumference of delivery tube 14.

A current source (power supply 17) supplies pulsed current to current windings 47. Each pulse causes an electromagnetic effect whereby armature 49 will be drawn radially outward toward electromagnetic coil yoke 48, in turn causing delivery tube 14 to bulge in the area proximate to armature 49. The bulging of delivery tube 14 causes the pressure and velocity of a liquid within that tube to change, inducing a capillary wave on the liquid jet stream. This in turn induces droplets to form on the liquid jet stream shortly after the jet exits orifice 22, as described above. For use with liquid metals and solders, it is preferred that droplet generator 300 be maintained in a suitably heated state. Toward that end, heater 18 may surround droplet generator 300. Other means of heating droplet generator 300 are mentioned above.

Drop-on-Demand Mode

Figure 6:
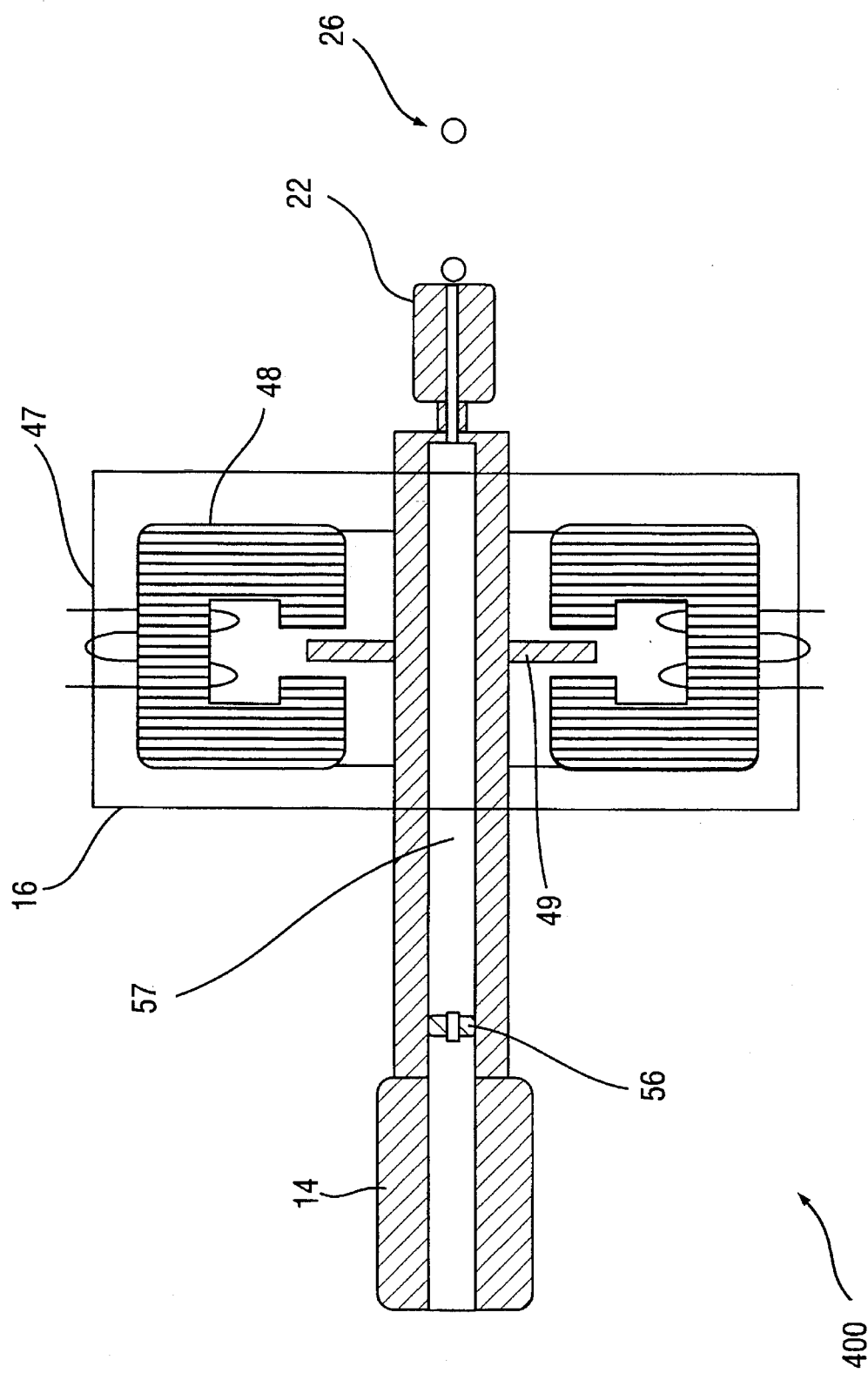
FIG. 6 is a schematic representation of a drop-on-demand electromechanical direct-coupled droplet generator using current-to-magnetic-material excitation according to the present invention.

FIG. 6 is a schematic representation of a drop-on-demand electromechanical direct-coupled droplet generator using current-to-magnetic-material excitation according to the present invention. Droplet generator 400 operates on the same basic principles as described for droplet generator 300 of FIG. 5. However, single droplets are produced on demand instead of a continuous stream of regularly spaced droplets.

Power supply 17 supplies a single, large pulse of current on demand to current windings 47 of driver 16. This causes electromagnetic coil yoke 48 to draw armature 49 radially outward, as described above, creating a single perturbation force on the liquid within tuned fluid chamber 57. This force in turn causes a quantity of liquid to be moved through fluid chamber 57 and to be expelled from orifice 22, which is coupled to tuned fluid chamber 57. Surface tension on the liquid will cause the liquid to assume a spherical shape (droplet) within a brief period after exiting orifice 22. Configurations for armature 49 may be as shown in FIGS. 5A and 5B.

Flow restricting orifice 56 positioned within delivery tube 14 creates tuned fluid chamber 57 between orifice 56 and exit orifice 22. Flow restricting orifice 56 prevents an excessive quantity of liquid to be ejected from tuned fluid chamber 57 in a direction opposite to the desired direction (i.e., through orifice 22).

It is also preferred that a heat source (not shown in FIG. 6) be provided to maintain the contents of delivery tube 14 in a heated state, as shown in FIG. 5.

Magnetostriction Excitation Continuous Mode

Figure 7:
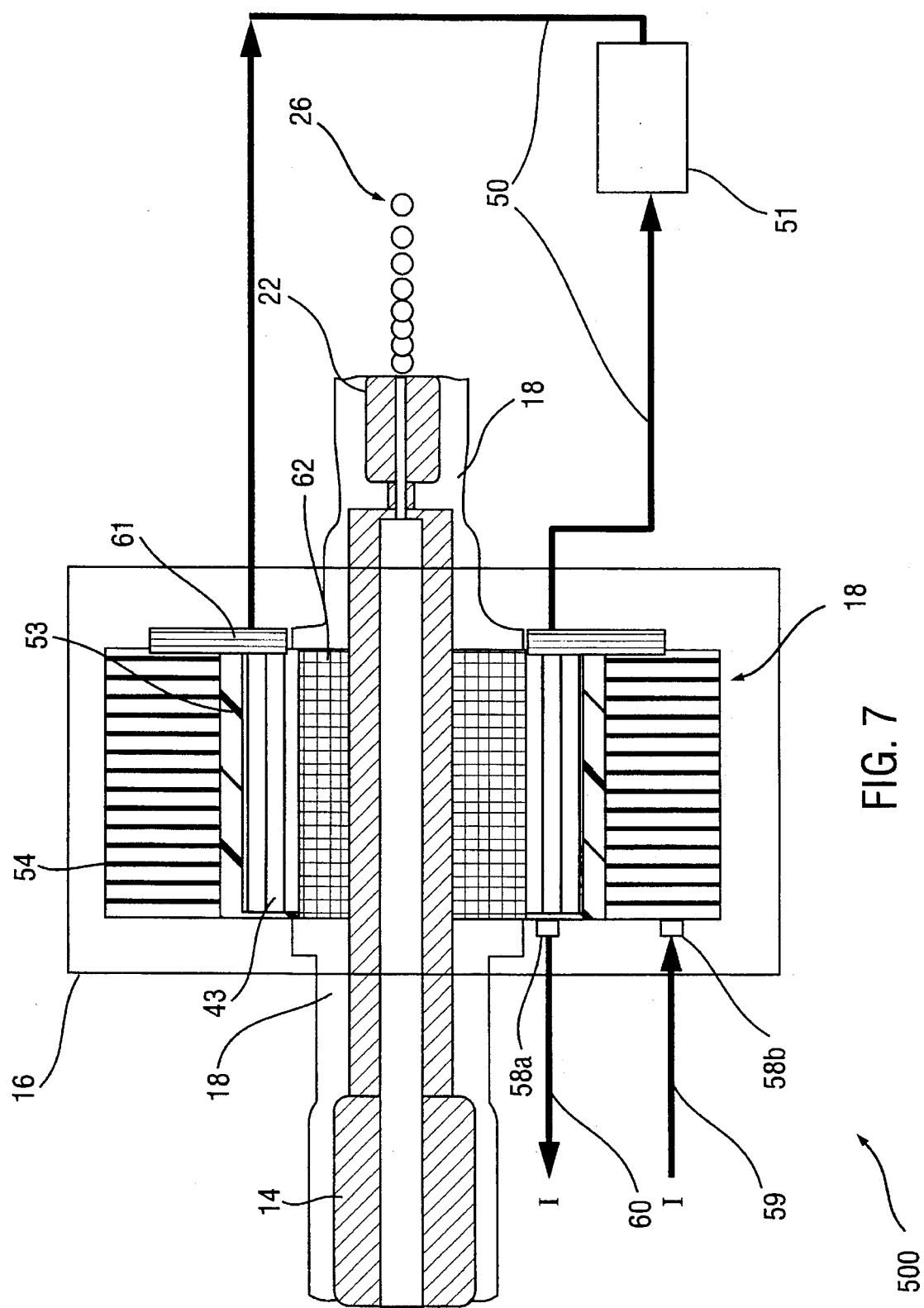
FIG. 7 is a schematic representation of a continuous, thermally-cooled droplet generator using magnetostriction excitation according to the present invention.

FIG. 7 is a schematic representation of a continuous, thermally-cooled droplet generator 500 using magnetostriction excitation according to the present invention. Driver 16 (shown in cross section) is coupled to liquid delivery tube 14, and comprises insulator 62, which is an acoustically conducting and thermally insulating material, such as glass, ceramic, etc. Coupled to insulator 62 is metal conductor 43. A dimension-changing means (magnetostrictive cylinder 53) is sandwiched between metal conductors 43 and 54. Conductor 54 also functions as an acoustically tuned backing ring in the manner described with reference to FIG. 3. Conductors 43 and 54 may comprise stainless steel, for example.

As described in the Background portion of this specification, magnetostrictive elements are sensitive to heat. Heater 18 is thermally coupled to delivery tube 14 to maintain the contents of the tube in a heated or molten (liquid) state. To avoid overheating the magnetostrictive element, however, heater 18 is preferably not in direct contact with driver 16. Additionally, according to the present invention, magnetostrictive cylinder 53 may be cooled by drawing heat away from magnetostrictive cylinder 53 through conductors 43 and 54 to thermally electric tap ring 61. Tap ring 61 in turn is coupled to heat conduit 50, which draws heat to thermal electric cooler 51, such as that manufactured by Marlow Industries of Dallas, Tex. The concept of thermal electric cooling is detailed in *Direct Energy Conversion* by Stanley August (1971) at pp. 153–57, the disclosure of which is herein incorporated by reference. Other suitable heat sinks may be accomplished by traditional methods known to those of skill in the art, including convective fluids, heat pipes, evaporative heat transfer, and thermal electric refrigeration.

To generate droplets, pulsed current is supplied from a power supply (not shown) to current inlet 59, which is coupled to backing ring 54 through electrical contact 58a. Current exits from conductor 43 through contact 58b to current outlet 60. This produces a magnetic field along the circumferential axis of the delivery tube. On each current pulse, magnetostrictive cylinder 53 changes dimensions in response to the magnetic field, causing a perturbation force to act through conductor 43 and insulator 62 (which is acoustically conducting) and on delivery tube 14. This force causes a disturbance on the liquid jet stream in the manner described above, breaking the jet stream into uniformly-sized and uniformly-spaced droplets 26 shortly after the jet stream exits orifice 22.

Drop-on-Demand Mode

Figure 8:
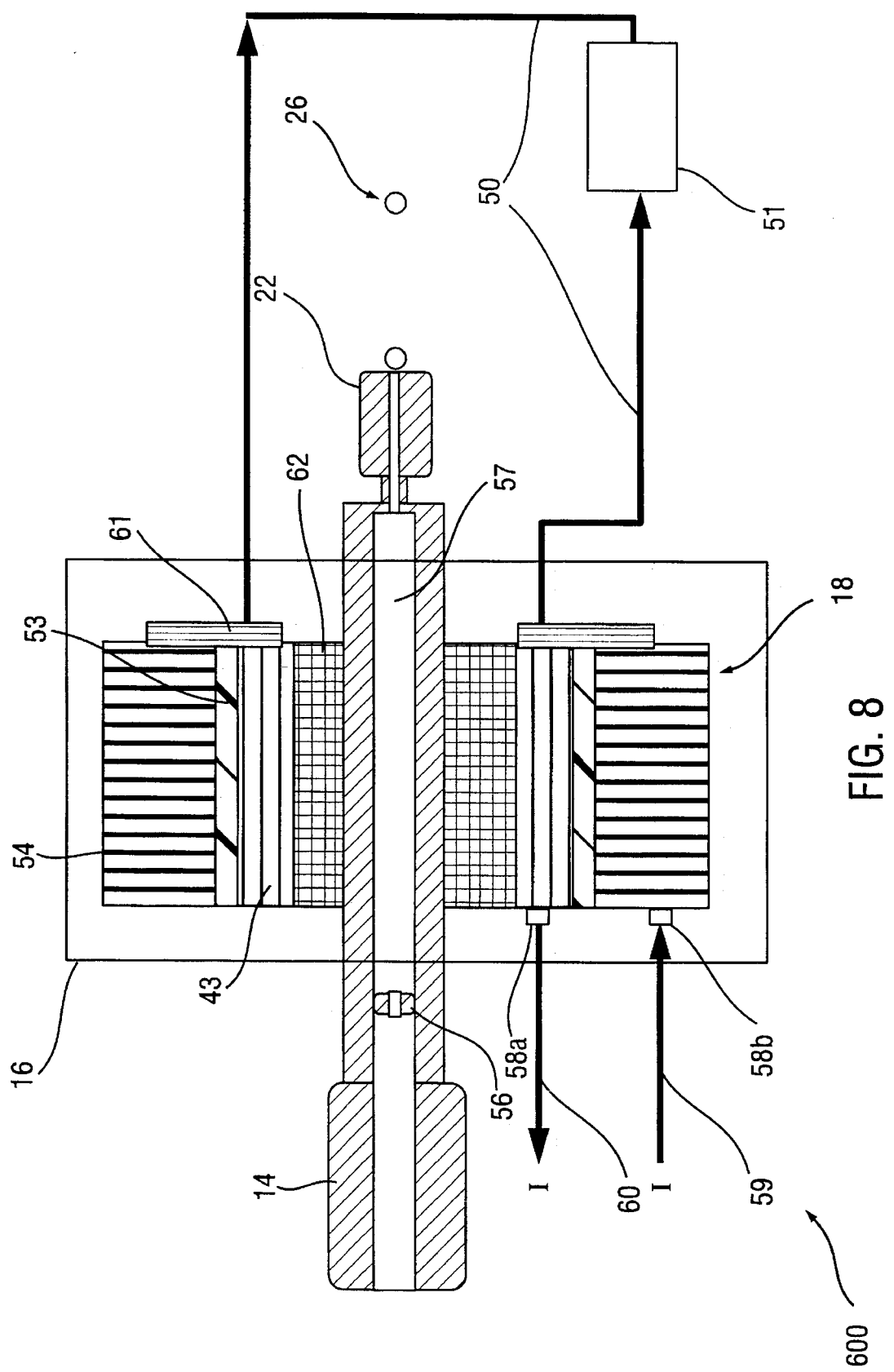
FIG. 8 is a schematic representation of a drop-on-demand thermally-cooled droplet generator using magnetostriction excitation according to the present invention.

FIG. 8 is a schematic representation of a drop-on-demand thermally-cooled droplet generator 600 using magnetostriction excitation according to the present invention. Driver 16 of droplet generator 600 operates on the same basic principles as described for droplet generator 500 of FIG. 7. However, single droplets 26 are produced on demand in response to a single, large pulse of current from power supply 17, instead of a continuous stream of regularly spaced droplets.

Flow restricting orifice 56 positioned within delivery tube 14 creates tuned fluid chamber 57 between orifice 56 and exit orifice 22. Flow restricting orifice 56 prevents an excessive quantity of liquid to be ejected from tuned fluid chamber 57 in a direction opposite to the desired direction (i.e., through orifice 22).

It is also preferred that a heat source (not shown in FIG. 8) be provided to maintain the contents of delivery tube 14 in a heated state, as shown in FIG. 7.

Magnetohydrodynamic Excitation

Figure 9:
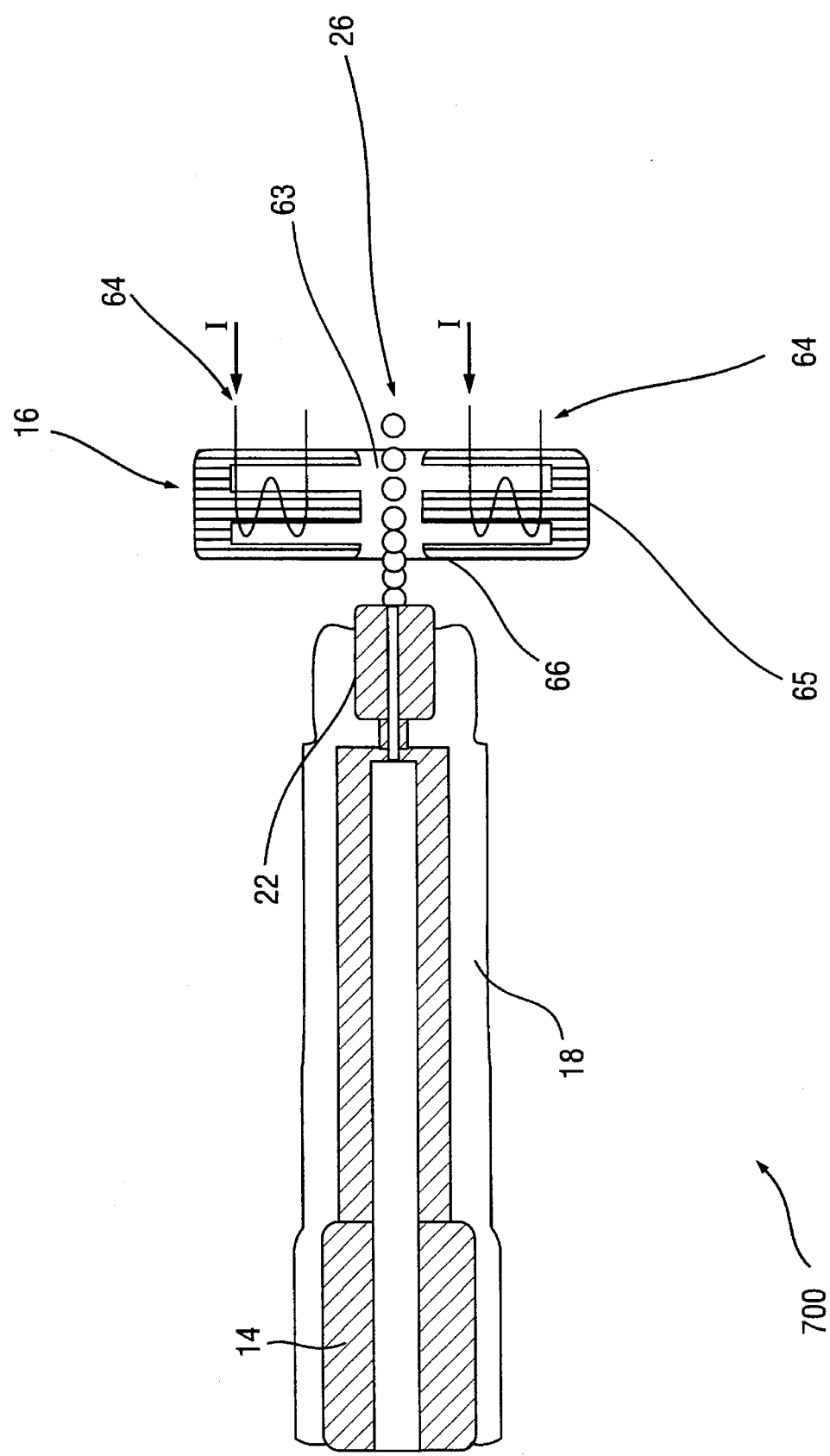
FIG. 9 is a schematic representation of a continuous droplet generator using magnetohydrodynamic excitation according to the present invention.

FIG. 9 is a schematic representation of a continuous droplet generator 700 using magnetohydrodynamic excitation according to the present invention for use with conductive liquids. Driver 16 is not coupled to delivery tube 14, but instead acts directly on the liquid jet stream that is expelled from orifice 22. Driver 16 comprises magnetic field yoke 65 which has spacings between arms 66. Arms 66 correspond to points of field intensity maximums in the magnetic field generated when current is applied from a power supply (not shown) to current windings 64. The current supplied may be DC or AC.

The liquid jet stream passes from orifice 22 through air gap 63 in magnetic field yoke 65. The periodic magnetic field acts upon the jet stream, producing perturbations of maximum strength on the surface of the jet stream corresponding to field intensity maximum points (focal points). These perturbations are amplified by the jet physics causing the jet to break up into droplets of uniform size and uniform spacing when the jet velocity satisfies a synchronous condition. A synchronous condition has been found to exist when the maximum spacing between points of maximum field intensity is approximately about 8.98 times the radius of the exit orifice. The spacing between droplets, in turn, may be predicted from the spacing of the magnetic focal points (i.e., from the spacing between arms 66) and the velocity of the liquid jet stream.

Piezoelectric Excitation Continuous Mode

Figure 10:
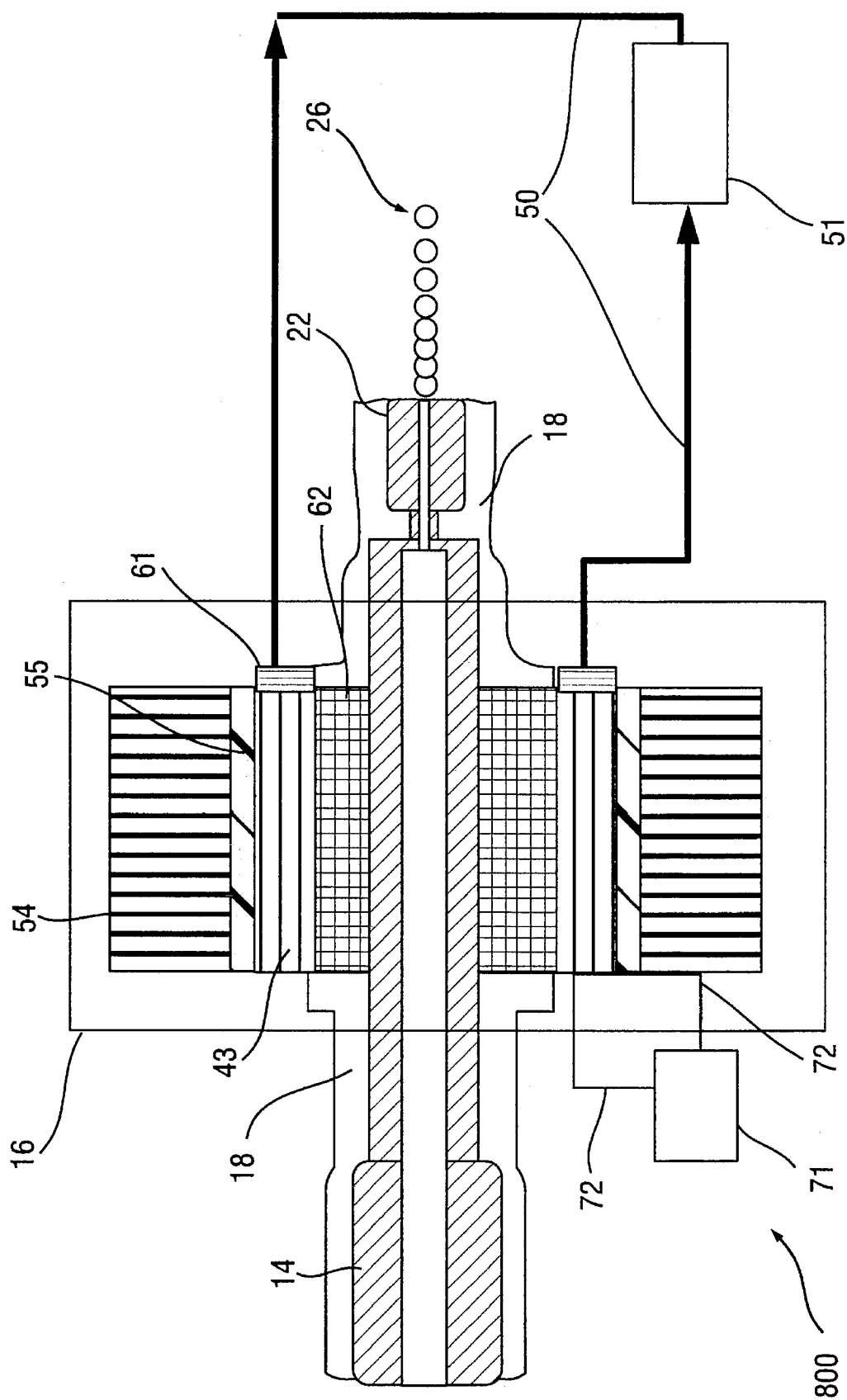
FIG. 10 is a schematic representation of a thermally-cooled, continuous droplet generator using piezoelectric excitation according to the present invention.

FIG. 10 is a schematic representation of a thermally-cooled, continuous droplet generator 800 using piezoelectric excitation according to the present invention. Driver 16 (shown in cross section) is coupled to liquid delivery tube 14, and comprises insulator 62, which is an acoustically conducting and thermally insulating material, such as glass, ceramic, etc. Coupled to insulator 62 is metal conductor 43. A dimension-changing means (piezoelectric crystal 55) is sandwiched between metal conductors 43 and 54. Conductor 54 also functions as an acoustically tuned backing ring in the manner described with reference to FIG. 3.

Power supply 71 supplies pulsed voltage through connections 72 to conductors 43, 54 of driver 16. This voltage pulse is transmitted through the conductors to piezoelectric crystal 55, which changes dimensions in response to the resulting electric field. The change in dimensions produces a force, which is coupled through acoustical conductor 62 to delivery tube 14. This in turn results in a perturbation on the fluid jet stream in delivery tube 14, causing the jet stream to break into uniformly-sized and uniformly-spaced droplets shortly after exiting orifice 22.

Heater 18 is used delivery tube 14 to maintain the contents of the tube in a heated or molten (liquid) state. To avoid overheating the piezoelectric crystal, however, heater 18 is preferably not in direct contact with driver 16. As described in connection with FIG. 7, piezoelectric crystal 55 may be cooled by drawing heat away from piezoelectric crystal 55 through conductors 43 and 54 to thermally electric tap ring 61. Tap ring 61 in turn is coupled to heat conduit 50, which draws heat to thermal electric cooler 51.

The thickness required of thermal insulator 62 in each embodiment using a piezoelectric crystal or magnetostrictive element (FIGS. 7, 8, 10, and 11) depends on its thermal efficiency and the temperature difference between tube 14 and heat exchanger 43, as well as allowable heat flux from tube 14 to piezoelectric crystal 55 or magnetostrictive element 53 (allowable steady state heat flux being limited by the maximum operating temperature of piezoelectric crystal 55 or magnetostrictive element 53 and the maximum steady state heat rejection from crystal 55 or element 53 to backing ring 54). Depending on the heat rejection capability of piezoelectric crystal 55 or magnetostrictive element 53 and the efficiency of thermal insulator 62 or first heat exchanger 43, some embodiments of the invention may require only thermal insulator 62 or first heat exchanger 43 alone, but not both.

Drop-on-Demand Mode

Figure 11:
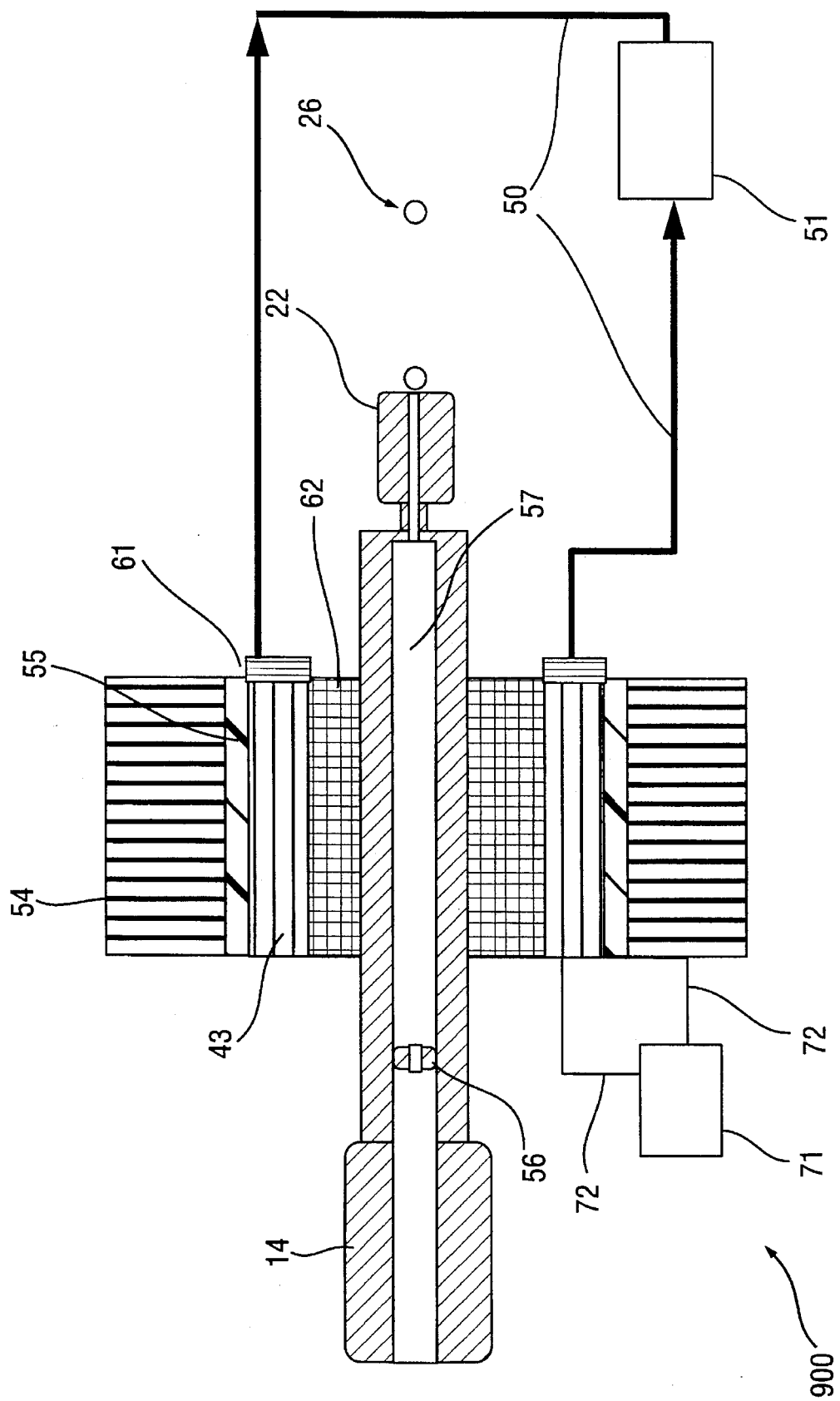
FIG. 11 is a schematic representation of a thermally-cooled, drop-on-demand droplet generator using piezoelectric excitation according to the present invention.

FIG. 11 is a schematic representation of a thermally-cooled, drop-on-demand droplet generator 900 using piezoelectric excitation according to the present invention. Droplet generator 900 operates on the same basic principles as described for droplet generator 800 of FIG. 10. However, single droplets are produced on demand instead of a continuous stream of regularly spaced droplets. Power supply 71 supplies a single, large pulse of voltage through electrical connections 72 on demand to conductors 43, 54 of driver 16. This voltage pulse is transmitted through the conductors to piezoelectric crystal 55, which changes dimensions in response to the resulting electric field. This in turn results in a large, single force that is reflected by backing ring 54 toward tuned fluid chamber 57, causing a quantity of liquid to be moved through fluid chamber 57 and to be expelled from orifice 22, which is coupled to tuned fluid chamber 57. Surface tension on the liquid will cause the liquid to assume a spherical shape (droplet) within a brief period after exiting orifice 22.

Flow restricting orifice 56 positioned within delivery tube 14 creates tuned fluid chamber 57 between orifice 56 and exit orifice 22. Flow restricting orifice 56 prevents an excessive quantity of liquid to be ejected from tuned fluid chamber 57 in a direction opposite to the desired direction (i.e., through orifice 22).

It is also preferred that a heat source (not shown in FIG. 11) be provided to maintain the contents of delivery tube 14 in a heated state, as shown in FIG. 10.

Applications

Liquid droplet generators according to the present invention permit an ink-jet type deposition technique wherein drops of uniform size and controlled spacing may be precisely placed. This has advantages in a variety of applications.

1) Soldering techniques:

Using apparatus and methods according to the present invention permits solder to be printed after the printed circuit board has been fabricated. This provides a flexibility in fabrication processes and sequencing that is not possible by currently known methods. Although board flatness is critical in screen printing of solder paste, liquid-metal droplet systems according to the present invention are less sensitive to flatness. A controlled quantity of solder allows an optimal amount of solder to be dispensed for each component with accuracy and predictability. In addition, different thicknesses of solder on the same circuit board may be deposited. By varying parameters such as the diameter of the orifice, metal droplets of varying sizes may be obtained in a controlled and predictable manner. An optimum solder amount may then be placed according to the physical demands of different-sized components.

The uniformity of droplets formed by the apparatus and method of the present invention renders feasible deposition of solder on device pads for special packaging. Several new bonding processes require creation of a solder ball directly on the device pad. Examples include Flip Chip Bonding, ball grid arrays, bumps for Tape Automated Bonding (TAB), solder pads for flex circuit interconnects, etc. Flip Chip Bonding requires the creation of a solder ball directly on the integrated circuit (IC) bonding pad by solder plating followed by reflow to let surface tension create the spherical ball. Because the liquid-metal droplet systems according to the present invention dispense metal droplets of predictable and uniform size, flip chips may be bonded by dispensing solder droplets directly onto the device bond pads or onto the circuit board surface.

2) Direct deposition of circuit patterns and devices:

The accuracy and predictability of the device and method of the present invention will permit circuit paths to be drawn remotely using direct deposition of silver, copper, gold or other suitable alloys or conductive epoxys onto circuit boards. Suitable intermediate material or some other inclusion may be desired to improve adhesion or to modify material properties (such as dielectric constant or conductivity, etc.) in a predetermined manner. Passive devices such as resistors, inductors, capacitors and diodes may be directly deposited onto a circuit board using the apparatus and methods of the present invention with suitable combinations of materials. In addition, active devices such as transistors may be fabricated directly on the circuit board using the apparatus and methods of the present invention. Rapid prototyping and just-in-time manufacturing is thus feasible.

3) Production of balls:

Balls of various materials and of predictable and uniform dimensions may be produced for various applications, including: micro ball bearings; solder balls for ball grid arrays; metal balls for use in thick film or solder paste; semiconductor balls for fabrication of thermoelectric devices elements; semiconductor balls for fabrication of photovoltaic devices; glass balls for fiber optics; dielectric spheres for heat sensitive epoxy; and balls of high temperature material for use as feedstock in further manufacturing process (e.g., enriched uranium or plutonium for fabrication of nuclear fuel).

4) Manufacture and repair:

With the capability for emitting droplets of high-temperature liquids, the apparatus and devices of the present invention may be used in various manufacturing and repair applications, such as micro-welding, brazing, and sealing of joints using molten metals. The accuracy, predictability, and fine droplet stream possible according to the present invention are particularly suited for use in jewelry manufacture and repair.

5) Interconnection techniques:

New and unique methods of interconnection for multi-chips modules (MCM) and chip-on-board (COB) or semiconductor devices may be developed using the devices and methods of droplet generation according to the present invention. In addition, dispensing of glass droplets could be used for fiber optic interconnects and to product the fibers themselves.

6) Marking and pattern generation:

The accuracy and predictability of droplet generation according to the present invention can be exploited in a manner similar to ink-jet printing. This will permit "printing" or marking of product names, serial information, bar codes, etc. by selectively deflecting droplets from jet streams of high-temperature liquids such as metals or polymers.

Similarly, patterns of high-temperature liquids (such as polymers and epoxies) may be applied for electronic interconnections and adhesion purposes.

7) Microwave circuit component fabrication:

The liquid metal deposition technique according to the present invention permits the creation of structures with a large height-to-width aspect ratio. This property may be used to design unique microwave components by exploiting the space along the normal to the substrate surface for design and fabrication. Devices include filters, couplers, and slow-wave structures. Typical deposition materials include solder alloys, gold, nickel and copper.

8) Fabrication of micromechanical parts:

Micromechanical parts or other suitable three-dimensional structures, such as gears and levers, may be constructed using the precision placement and the stacking of droplets formed according to the present invention. Due to the inherent solidification process, parts produced according to this technique are of superior material strength.

9) Masks and pretin:

The liquid metal jet system according to the present invention may also be used to dispense patterns of liquid metal on a copper clad panel as a mask. For example, solder may be dispensed as a mask and pretin for the manufacturing of circuit boards. Extraneous copper may then be etched away, leaving the circuit board artwork intact and already pretinned. This process may replace photolithography (eliminating hazardous wastes and high costs associated therewith) by laying patterns down directly, there,by greatly increasing manufacturing flexibility.

10) Circuit board repair:

Repair of surface-mount electronic circuit boards may be realized by removing defective components and old solder according to conventional methods. Subsequently, accurate amounts of solder may be dispensed according to the present invention in a precise pattern to allow a more reliable repair when the component is reflowed. For example, this will result in reduced likelihood of excess solder being inadvertently placed at a particular joint to bridge between conductors or to "lift" the component off the conductor pads.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size, and arrangement of parts. For example, equivalent elements or materials may be substituted for those illustrated and described herein, and certain features of the invention may be utilized independently of the use of other features, all as would be apparent to one skilled in the art after having the benefit of this description of the invention.

What is claimed is:

1. A liquid droplet generator, comprising:
   a delivery tube having a wall and an exit orifice;
   an electromechanical driver element disposed to transmit pressure pulses to said wall;
   a power supply coupled to said electromechanical driver; and
   a high-temperature heat source thermally coupled to said delivery tube, said high-temperature heat source adapted to heat said delivery tube to temperatures in excess of the Curie temperature of a piezoelectric material.

2. The droplet generator of claim 1, wherein said high-temperature heat source is coupled to said delivery tube and substantially surrounds said delivery tube.

3. The droplet generator of claim 1, further comprising a temperature controller coupled to said high-temperature heat source.

4. The droplet generator of claim 1, wherein said high-temperature heat source comprises a heated chamber adapted to receive said droplet generator.

5. The droplet generator of claim 1, wherein an internal diameter of said exit orifice is smaller than an internal diameter of said delivery tube.

6. The liquid droplet generator of claim 1, wherein the Curie temperature of a piezoelectric material is about 350° C.

7. A liquid droplet generator, comprising:
   a delivery tube having a wall and an exit orifice;
   an electromechanical driver element disposed to transmit pressure pulses to said wall; and
   a power supply coupled to said electromechanical driver element;
   wherein said electromechanical driver element comprises:
      current windings circumferentially surrounding said delivery tube and acoustically coupled thereto, said current windings comprising a first current winding adjacent to a second current winding, said current windings also coupled to said power supply;
      electrical insulation disposed between said first and second current windings;
      wherein said first and second current windings are disposed so that a current travelling through said first winding will be of opposite polarity to a current travelling through said second winding; and
      a force retaining ring substantially surrounding said current windings.

8. The droplet generator of claim 7, wherein said power supply is adapted to supply pulsed current to said current windings at a frequency corresponding to a desired spacing between droplets to be generated by said droplet generator.

9. The droplet generator of claim 7, wherein said power supply is adapted to supply a single pulse of current to said current windings on demand.

10. The droplet generator of claim 9, further comprising a flow-restricting orifice disposed within said delivery tube defining a tuned fluid chamber in said delivery tube bounded by said flow-restricting orifice at a first end and said exit orifice at a second end.

11. A liquid droplet generator, comprising:

a delivery tube having a wall and an exit orifice;

an electromechanical driver element disposed to transmit pressure pulses to said wall; and a power supply coupled to said electromechanical driver element;

wherein said electromechanical driver element comprises:
an electromagnetic field generator substantially surrounding the circumference of said delivery tube; and
an armature circumferentially coupled to said delivery tube and proximate to said electromagnetic field generator, said armature comprising soft magnetic material.

12. The droplet generator of claim 11, wherein said electromagnetic field generator comprises an electromagnetic coil yoke having current windings coupled to said power supply, said electromagnetic coil yoke being gapped to receive a portion of said armature.

13. The droplet generator of claim 11, wherein said armature comprises symmetrically spaced tabs.

14. The droplet generator of claim 11, wherein said armature comprises a notched ring, said notches being symmetrically spaced.

15. The droplet generator of claim 11, wherein said power supply is adapted to supply pulsed current to said driver at a frequency corresponding to a desired spacing between droplets to be generated by said droplet generator.

16. The droplet generator of claim 11, wherein said power supply is adapted to supply a single pulse of current to said driver on demand.

17. The droplet generator of claim 16, further comprising a flow-restricting orifice disposed within said delivery tube defining a tuned fluid chamber in said tube bounded-by said flow-restricting orifice at a first end and said exit orifice at a second end.

18. A liquid droplet generator, comprising:

a delivery tube having a wall and an exit orifice;

an electromechanical driver element disposed to transmit pressure pulses to said wall; and a power supply coupled to said electromechanical driver element;

wherein said electromechanical driver element comprises:
an insulator coupled to said delivery tube and circumferentially surrounding said delivery tube over a portion of the length of said delivery tube, said insulator comprising an acoustically conductive, thermally insulating material;
a first conductor substantially surrounding said insulator and coupled thereto;
a dimension-changing means coupled to said first conductor;
a force retaining ring of electrically conductive material substantially surrounding said dimension-changing means and coupled thereto;
said first conductor and said force retaining ring coupled to said power supply; and
cooling means disposed to draw heat away from said first conductor and said force retaining ring.

19. The droplet generator of claim 18, wherein said cooling means comprises:

a thermal electric tap ring coupled to said first conductor and said force retaining ring;

heat conduit coupled to said thermal electric tap ring; and a heat sink coupled to said heat conduit.

20. The droplet generator of claim 19, wherein said heat sink comprises a thermal-electric cooler.

21. The droplet generator of claim 18, wherein said dimension-changing means comprises a magnetostrictive element coupled to said power supply, wherein said power supply is adapted to supply pulsed current to said driver at a frequency corresponding to a desired spacing between droplets to be generated by said droplet generator.

22. The droplet generator of claim 18, wherein said dimension-changing means comprises a magnetostrictive element coupled to said power supply, wherein said power supply is adapted to supply a single pulse of current to said magnetostrictive element on demand.

23. The droplet generator of claim 22, further comprising a flow-restricting orifice disposed within said delivery tube defining a tuned fluid chamber in said delivery tube bounded by said flow-restricting orifice at a first end and said exit orifice at a second end.

24. The droplet generator of claim 18, wherein said dimension-changing means comprises a piezoelectric crystal coupled to said power supply, wherein said power supply is adapted to supply pulsed voltage to said driver at a frequency corresponding to a desired spacing between droplets to be generated by said droplet generator.

25. The droplet generator of claim 18, wherein said dimension-changing means comprises a piezoelectric crystal coupled to said power supply, wherein said power supply is adapted to supply a single pulse of voltage to said driver on demand.

26. The droplet generator of claim 25, further comprising a flow-restricting orifice disposed within said delivery tube defining a tuned fluid chamber in said delivery tube bounded by said flow-restricting orifice at a first end and said exit orifice at a second end.

27. A liquid droplet generator, comprising:

a delivery tube having a wall and an exit orifice, said delivery tube adapted to transmit a liquid jet stream through said exit orifice;

an electromechanical driver element disposed to receive said liquid jet stream, said driver element comprising:
a magnetic field yoke having arms corresponding to points of maximum field intensity; and
current windings disposed about a portion of said magnetic field yoke; and a power supply coupled to said current windings of said electromechanical driver element.

28. The droplet generator of claim 27, further comprising a heat source thermally coupled to said delivery tube, wherein said heat source is coupled to said delivery tube and substantially surrounds said delivery tube.

29. The droplet generator of claim 28 further comprising a temperature controller coupled to said heat source.

30. The droplet generator of claim 27, further comprising a heat source thermally coupled to said delivery tube, wherein said heat source comprises a heated chamber adapted to receive said droplet generator.

31. A high-temperature liquid droplet generator, comprising:
   a chamber adapted to receive a high-temperature liquid having a temperature in excess of the Curie temperature of a piezoelectric material, said chamber including a discharge orifice at one end;
   a heater positioned proximate the chamber and operable to maintain the high-temperature liquid inside the chamber at about said high temperature; and
   a pulsing energy source coupled to the chamber, said pulsing energy source being operable in a tuned relation with the chamber and the high-temperature liquid therein to generate pressure pulses in the liquid so as to discharge the liquid from the chamber as droplets related in number to the pressure pulses producing the droplets.

32. The generator of claim 31, wherein the pulsing energy source comprises an electromechanical driving element.

33. The high-temperature liquid droplet generator of claim 31, wherein the Curie temperature of a piezoelectric material is about 350° C.

34. A method for generating droplets from a high-temperature liquid, comprising:
   delivering a high-temperature liquid having a temperature in excess of the Curie temperature of a piezoelectric material to a liquid droplet generator in a jet, the liquid droplet generator comprising:
      a delivery tube having a wall and an exit orifice, said delivery tube adapted to receive said liquid jet; and
      an electromechanical driver element coupled to said wall;
   electrically exciting said electromechanical driver element to compress said wall; and
   expelling at least one liquid droplet from said exit orifice.

35. The method of claim 34, wherein said exciting and expelling steps comprise:
   supplying pulsed current to said electromechanical driver element;
   generating opposing current forces surrounding said delivery tube;
   vibrating said wall of said delivery tube in response to said opposing current forces;
   inducing a waveform on said liquid jet in said delivery tube in response to said vibrations; and
   amplifying said waveform to cause said liquid jet to break into droplets after exiting said exit orifice.

36. The method of claim 34, wherein the Curie temperature of a piezoelectric material is about 350° C.

37. A method for generating liquid droplets, comprising:
   delivering liquid to a liquid droplet generator in a jet, the liquid droplet generator comprising:
      a delivery tube having a wall and an exit orifice, said delivery tube adapted to receive said liquid jet; and
      an electromechanical driver element coupled to said wall;
   electrically exciting said electromechanical driver element to compress said wall; and
   expelling at least one liquid droplet from said exit orifice;
   wherein said electromechanical driver element comprises a piezoelectric crystal acoustically coupled to said wall and thermally insulated from said wall.

38. The method of claim 37, wherein exciting and expelling steps comprise:
   supplying pulsed voltage across said piezoelectric crystal;
   cooling said piezoelectric crystal;
   causing said piezoelectric crystal to alternately expand and contract in response to said pulsed voltage;
   vibrating said liquid jet in said delivery tube in response to said expansion and contraction;
   inducing a waveform on said liquid jet in said delivery tube in response to said vibrations; and
   amplifying said waveform to cause said liquid jet to break into droplets after exiting said orifice.

39. A method for generating liquid droplets, comprising:
   delivering liquid to a liquid droplet generator in a jet, the liquid droplet generator comprising:
      a delivery tube having a wall and an exit orifice, said delivery tube adapted to receive said liquid jet; and
      an electromechanical driver element coupled to said wall;
   electrically exciting said electromechanical driver element to compress said wall; and
   expelling at least one liquid droplet from said exit orifice;
   wherein said exciting and expelling steps comprise:
      supplying pulsed current to said driver;
      generating a pulsed magnetic field substantially and symmetrically surrounding said delivery tube in response to said pulsed current;
      alternately expanding and contracting a portion of said wall of said delivery tube radially in response to said pulsed magnetic field;
      vibrating said liquid jet in said delivery tube in response to said expansion and contraction;
      inducing a waveform on said liquid jet in said delivery tube in response to said vibrations; and
      amplifying said waveform to cause said liquid jet to break into droplets after exiting said orifice.

40. A method for generating liquid droplets, comprising:
   delivering liquid to a liquid droplet generator in a jet, the liquid droplet generator comprising:
      a delivery tube having a wall and an exit orifice, said delivery tube adapted to receive said liquid jet; and
      an electromechanical driver element coupled to said wall;
   electrically exciting said electromechanical driver element to compress said wall; and
   expelling at least one liquid droplet from said exit orifice;
   wherein said electromechanical driver element comprises a magnetostrictive element acoustically coupled to said wall and thermally insulated from said wall.

41. The method of claim 40, wherein exciting and expelling steps comprise:
   supplying pulsed current to said magnetostrictive element;
   cooling said magnetostrictive element;
   causing said magnetostrictive element to alternately expand and contract in response to said pulsed current;
   vibrating said liquid jet in said delivery tube in response to said expansion and contraction;
   inducing a waveform on said liquid jet in said delivery tube in response to said vibrations; and
   amplifying said waveform to cause said liquid jet to break into droplets after exiting said orifice.

42. A method of generating liquid droplets, comprising:
   delivering liquid to a liquid droplet generator in a jet, the generator comprising:
      a delivery tube having a wall and an exit orifice;
      an electromagnetic driver element disposed to receive said liquid jet stream, said driver element comprising:

a magnetic field yoke having a plurality of arms at spaced intervals; and current windings disposed about a portion of said magnetic field yoke;

heating said delivery tube;

supplying current to said current windings of said driver element;

generating a magnetic field from said magnetic field yoke, said magnetic field having maximum points of maximum field intensity corresponding to said arms of said field yoke;

transmitting a liquid jet stream through said exit orifice and through said magnetic field; and breaking the liquid jet stream into a series of droplets in response to said magnetic field, said droplets having a spacing corresponding to the spacing of said points of maximum field intensity.

* * * * *